(12) United States Patent
Tanaka (10) Patent No.: US 7,915,563 B2
(45) Date of Patent: Mar. 29, 2011

(54) ARC DETECTOR FOR PLASMA PROCESSING SYSTEM

(75) Inventor: Ryohei Tanaka, Osaka (JP)

(73) Assignee: DAIHEN Corporation, Osaka (JP)

( * ) Notice: Subject to any disclaimer, the term of this patent is extended or adjusted under 35 U.S.C. 154(b) by 708 days.

(21) Appl. No.: 11/906,120

(22) Filed: Sep. 28, 2007

(65) Prior Publication Data

US 2008/0149603 A1   Jun. 26, 2008

(30) Foreign Application Priority Data

Sep. 28, 2006   (JP) ................................. 2006-264844

(51) Int. Cl.
*B23K 10/00*   (2006.01)
(52) U.S. Cl. .......... 219/121.54; 219/121.57; 219/121.48
(58) Field of Classification Search ............. 219/121.54, 219/121.57, 121.48, 121.59
See application file for complete search history.

(56) References Cited

U.S. PATENT DOCUMENTS

| | | | |
|---|---|---|---|
| 5,810,963 | A | 9/1998 | Tomioka |
| 6,808,607 | B2 | 10/2004 | Christie |
| 6,967,305 | B2 | 11/2005 | Sellers |
| 7,514,936 | B2 | 4/2009 | Anwar et al. |
| 2005/0188922 | A1 | 9/2005 | Ishibashi et al. |

FOREIGN PATENT DOCUMENTS

| | | |
|---|---|---|
| JP | 5-318130 | 12/1993 |
| JP | 8-167500 | 6/1996 |
| JP | 9-92491 | 4/1997 |
| JP | 10-74734 | 3/1998 |
| JP | 2005-277397 | 10/2005 |
| JP | 2006-140440 | 6/2006 |
| JP | 2006-528731 | 12/2006 |
| WO | WO 2005/020273 | 3/2005 |

*Primary Examiner* — Mark H Paschall
(74) *Attorney, Agent, or Firm* — Hamre, Schumann, Mueller & Larson, P.C.

(57) ABSTRACT

An arc detector is provided for a plasma processing system including a HF power source, a plasma processor, and a voltage/current signal detector. The arc detector includes a calculator for the phase difference between the AC voltage signal and the AC current signal, a calculator for an effective voltage based on the AC voltage signal, a calculator for an effective current based on the AC current signal, an FFT processor for the frequency spectrum of the AC voltage or current signal, and an arc analyzer connected to the phase difference calculator, effective voltage calculator, effective current calculator, and FFT processor. The arc analyzer calculates the plasma processor's impedance based on the calculated phase difference, effective voltage, and effective current. The arc analyzer monitors arcs in the plasma processor, based on the fluctuation rate of the calculated impedance and the output level of a frequency component in the spectrum.

6 Claims, 6 Drawing Sheets

ARC DETECTOR FOR PLASMA PROCESSING SYSTEM

BACKGROUND OF THE INVENTION

1. Field of the Invention

The present invention relates to an arc detector for a plasma processing system employed in a semiconductor manufacturing process. The present invention further relates to a program for operating a computer as an arc detector, and also to a recording medium for storing such a program.

2. Description of the Related Art

Figure 7:
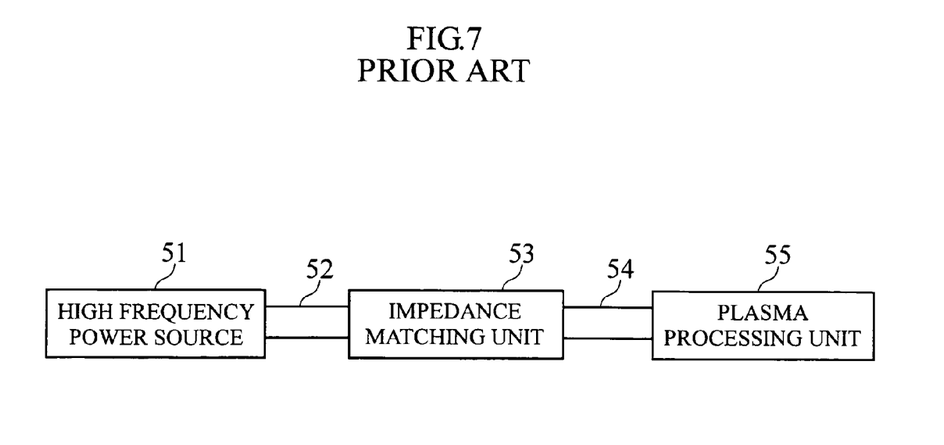
FIG. 7 is a block diagram showing the structure of a conventional plasma processing system.

FIG. 7 is a schematic block diagram showing a basic structure of a conventional plasma processing system. The system includes a high frequency power source 51, an impedance matching unit 53, and a plasma processing unit 55. The high frequency power source 51 and the impedance matching unit 53 are connected via a transmission cable 52, and the impedance matching unit 53 and the plasma processing unit 55 are connected via a load connection unit 54. The impedance matching unit 53 serves to match the impedance of the high frequency power source 51 (input impedance) and that of the plasma processing unit 55 (load impedance).

The high frequency power source 51 includes a power amplifying circuit, an oscillating circuit, and so forth. The high frequency power source 51 outputs a high frequency power of a predetermined value to the plasma processing unit 55, via the impedance matching unit 53.

The plasma processing unit 55 is an apparatus used to process a workpiece such as a semiconductor wafer or a liquid crystal substrate, by etching, CVD or the like. Specifically, the plasma processing unit 55 includes a plasma chamber, a vacuum container provided in the chamber, and a pair of electrodes provided in the vacuum container. Into the vacuum container a gas for generating plasma (such as nitrogen gas or argon gas) is introduced, and the high frequency power is supplied between the pair of electrodes. As a result, the gas is ionized thereby turning into plasma, which performs the processing of the workpiece.

In the plasma processing unit 55, an arc may be generated during the plasma processing. The arc thus generated may damage the workpiece, or even destroy the plasma processing unit 55 in case the arc is excessively intense. Generally, therefore, the high frequency power source 51 is provided with a function of detecting the arc generation, so as to reduce the high frequency power to be supplied to the plasma processing unit 55, or to completely cut off the power supply.

For example, JP-A-H08-167500 discloses the following system. Firstly a forward power into the plasma processing unit and a reflected power from the plasma processing unit are detected. According to a fluctuation pattern of the detected values, it is determined whether an arc has been generated. Upon deciding that an arc has been generated, the output of the high frequency power source is restrained, or even suspended as the case may be.

In the plasma processing unit 55, as already stated, the high frequency power is applied to the nitrogen gas or argon gas enclosed in the vacuum container to thereby turn the gas into plasma, and to perform a predetermined plasma processing. During such operation, the impedance of the plasma processing unit 55 is constantly fluctuating, and hence unstable. Accordingly, the impedance matching unit 53 serves to facilitate the high frequency power source 51 to efficiently supply the high frequency power to the plasma processing unit 55, under the situation where the impedance of the plasma processing unit 55 is fluctuating.

While the plasma processing unit 55 is normally performing the plasma processing, the impedance matching unit 53 effectively serves to match the impedance, and hence the reflected power from the plasma processing unit 55 is quite small. Once an arc is generated in the plasma processing unit 55, however, the impedance matching process may be disturbed. Generation of an arc that can, for example, destroy the workpiece or the plasma processing unit 55 with a single discharge action (hereinafter, "hard arc") causes the impedance of the plasma processing unit 55 to fluctuate so sharply, that the impedance matching unit 53 can no longer track the impedance fluctuation. In this case, therefore, the reflected power from the plasma processing unit 55 is sharply increased.

The arc detection system according to JP-A-H08-167500 monitors the fluctuation rate of the reflected power from the plasma processing unit, and determines that an arc discharge has occurred when the fluctuation rate exceeds a predetermined threshold value. Such conventional detection method primarily aims at detecting a hard arc, and hence a relatively high threshold value is set.

On the other hand, some arcs are so weak (hence called "soft arcs") that a single discharge does not damage the workpiece, but a succession of them can incur an uneven processing effect or a burn on the workpiece. These days the generation of the soft arc during the plasma processing has also come to be focused on, in order to maximize the quality of the workpiece.

Based on the conventional arc detection method, it apparently seems that lowering the threshold value for detecting the arc generation enables detecting the soft arc. However, the generation of the soft arc barely causes the fluctuation of the reflected power. This makes it quite difficult to distinguish whether a detected fluctuation rate of the reflected power is resultant from the soft arc generation, or from the natural impedance fluctuation. Lowering the threshold value under such circumstance often provokes erroneous detection of the arc generation, from what is actually the natural impedance fluctuation. Moreover, restraining or cutting off the supply of the high frequency power to the plasma processing unit based on the erroneous detection of the arc generation leads to significant degradation of the productivity of the liquid crystal substrate and other objects.

SUMMARY OF THE INVENTION

The present invention has been proposed under the circumstances described above. It is therefore an object of the present invention to provide an arc detector for detecting arc generation in a plasma processing system with high accuracy.

A first aspect of the present invention provides an arc detector to be used in a plasma processing system that includes a high frequency power source, a plasma processing unit that generates plasma with a high frequency power supplied by the high frequency power source so as to perform predetermined processing on a workpiece, and a voltage/current signal detection circuit that detects an AC voltage signal and an AC current signal. The arc detector comprises a phase difference calculation circuit that calculates a phase difference between the AC voltage signal and the AC current signal, a voltage effective value calculation circuit that calculates a voltage root-mean-square value based on the AC voltage signal, a current effective value calculation circuit that calculates a current root-mean-square value based on the AC current signal, a FFT processing unit that calculates a frequency spectrum of at least one of the AC voltage signal and the AC current signal, and an arc analysis unit connected to the phase difference calculation circuit, the voltage effective value calculation circuit, the current effective value calculation circuit, and the FFT processing unit. The arc analysis unit calculates the impedance of the plasma processing unit based on the calculated phase difference, the calculated voltage root-mean-square value, and the calculated current root-mean-square value. The arc analysis unit further determines whether or not an arc is generated in the plasma processing unit, based on at least the fluctuation rate of the impedance that has been calculated and the output level of a predetermined frequency component included in the spectrum calculated by the FFT processing unit.

In the arc detector thus constructed, the arc generation in the plasma processing unit is determined based on at least two physical quantities, namely the impedance fluctuation rate of the plasma processing unit and the output level of the predetermined frequency component included in the spectrum calculated by the FFT processing unit. Deciding the arc generation thus based on a plurality of physical quantities allows preventing erroneous detection of the arc generation from what is actually a natural impedance fluctuation.

Specifically, the arc detector according to the present invention calculates the phase difference, the voltage root-mean-square value, and the current root-mean-square value based on the AC voltage signal and the AC current signal which have been detected, and then calculates the impedance of the plasma processing unit based on the former calculation results. In the case where the fluctuation rate of the calculated impedance is not within a predetermined range, it is determined that there is a possibility that an arc has been generated. In this case, further a final decision on the arc generation is made, for example based on whether the output level of the predetermined frequency component included in the spectrum of the AC voltage signal or the AC current signal is not lower than the predetermined level. To make the final decision, at least one of the following criteria may be employed; whether the fluctuation rate of the voltage root-mean-square value is not higher than a predetermined value; whether the fluctuation rate of the current root-mean-square value is not lower than a predetermined value; and whether the phase difference between the AC voltage signal and the AC current signal is outside of a predetermined range.

A second aspect of the present invention provides a program that operates a computer as the foregoing arc detector.

A third aspect of the present invention provides a computer-readable recording medium that stores the foregoing program.

Other features and advantages of the present invention will become more apparent through the detailed description given below referring to the accompanying drawings.

DETAILED DESCRIPTION OF PREFERRED EMBODIMENTS

Preferred embodiments of the present invention will be described below with reference to the accompanying drawings.

Figure 1:
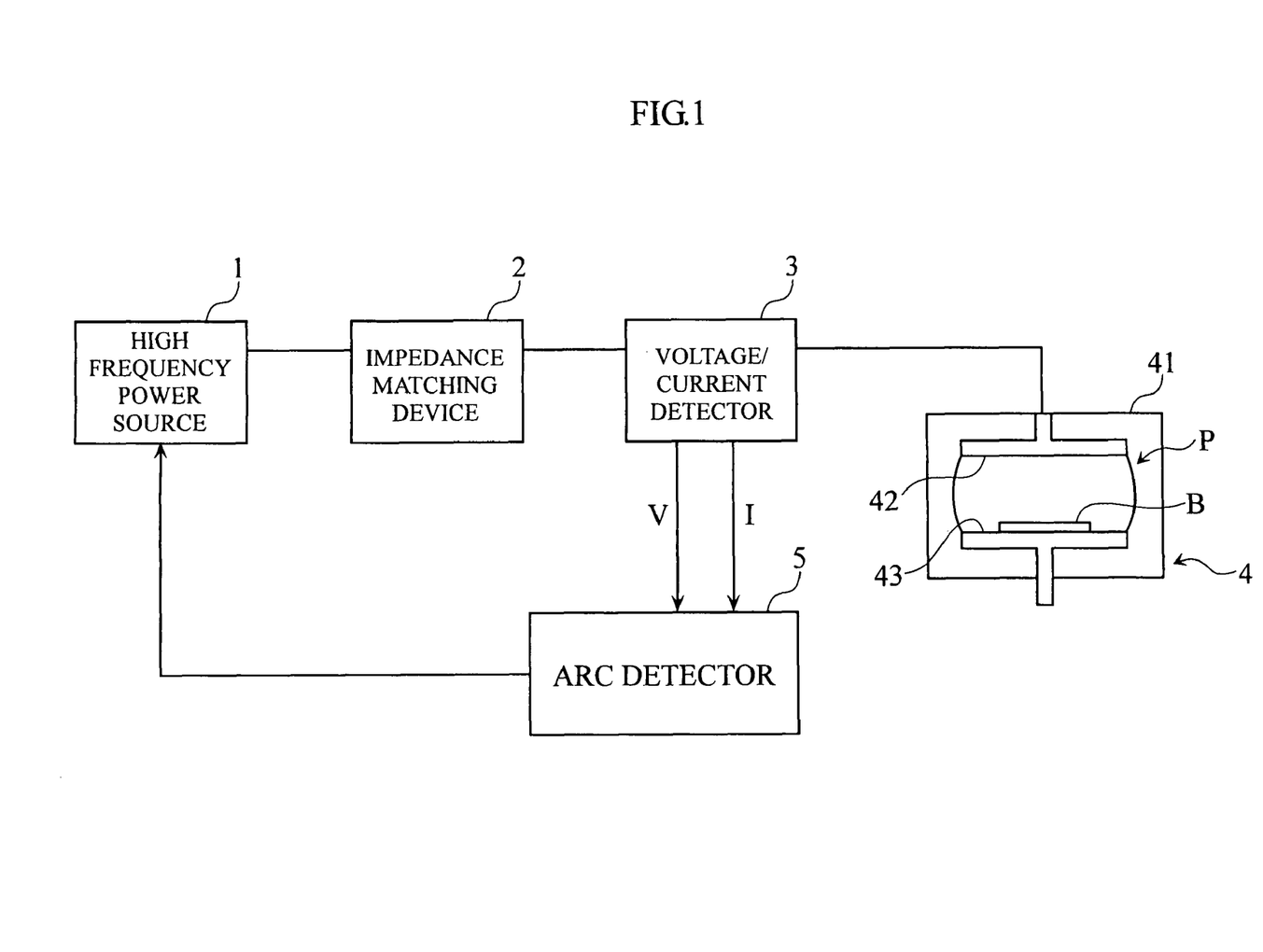
FIG. 1 is a diagram showing a plasma processing system to which an arc detector according to the present invention is applicable.

FIG. 1 is a block diagram showing a structure of a plasma processing system in which an arc detector according to the present invention may be incorporated. The plasma processing system serves to perform processing, for example plasma processing, on a workpiece such as a semiconductor wafer or a liquid crystal substrate. The plasma processing system includes a high frequency power source 1, an impedance matching device 2, a voltage/current detection device 3, a plasma processing unit 4, and an arc detector 5.

The high frequency power source 1 is connected to the impedance matching device 2 via a transmission line, for example constituted of a coaxial cable. The impedance matching device 2 is connected to the voltage/current detection device 3, and the voltage/current detection device 3 to the plasma processing unit 4, respectively. The arc detector 5 is connected to the high frequency power source 1 and to the voltage/current detection device 3.

The high frequency power source 1 supplies a high frequency power to the plasma processing unit 4. Generally, such power source is designed to output a high frequency power having an output frequency of hundreds of kHz. In this embodiment, the plasma processing unit 4 utilizes the frequency of 2.0 MHz or 13.56 MHz for the plasma processing, and hence the high frequency power source 1 is configured to supply the high frequency power of 2.0 MHz or 13.56 MHz, to the plasma processing unit 4. The high frequency power source 1 also performs predetermined tasks upon receipt of an arc detection signal from the arc detector 5. Examples of such tasks include notifying the user of arc generation, and storing data regarding the frequency of arc detection. The notification may be attained by a message displayed on a monitor screen, an alarm sound, or an alarm light. The user may choose and set one or more from these options. Further, in accordance with the user's preference, the occurrence of soft arcs may be prevented by lowering the output power of the high frequency power source 1. When appropriate, it may be arranged that a power shutdown mode can be selected for stopping the power supply from the high frequency power source 1.

The impedance matching device 2 serves to match the impedance between the high frequency power source 1 and the plasma processing unit 4, and includes impedance elements such as a capacitor and an inductor. Here, it will be assumed that the impedance of the high frequency power source 1 seen from the output terminal thereof (output impedance) is set at 50Ω, and the output terminal of the high frequency power source 1 is connected to the transmission line having a characteristic impedance of 50Ω. In this case, the impedance matching device 2 matches the impedance seen from the input terminal of the impedance matching device 2 toward the plasma processing unit 4 to 50 Ω.

After the plasma processing starts in the plasma processing unit 4, the state of the workpiece or of the plasma fluctuates according to the progress of the plasma processing, which provokes impedance fluctuation in the plasma processing unit 4. A fluctuation range of the impedance of the plasma processing unit 4 defined when the plasma processing is normally performed can be known in advance. Accordingly, a value appropriately selected out of the fluctuation range (hereinafter, representative value) is regarded as the impedance of the plasma processing unit 4, and the impedance matching device 2 is designed to perform the impedance matching according to the representative value.

Figure 2:
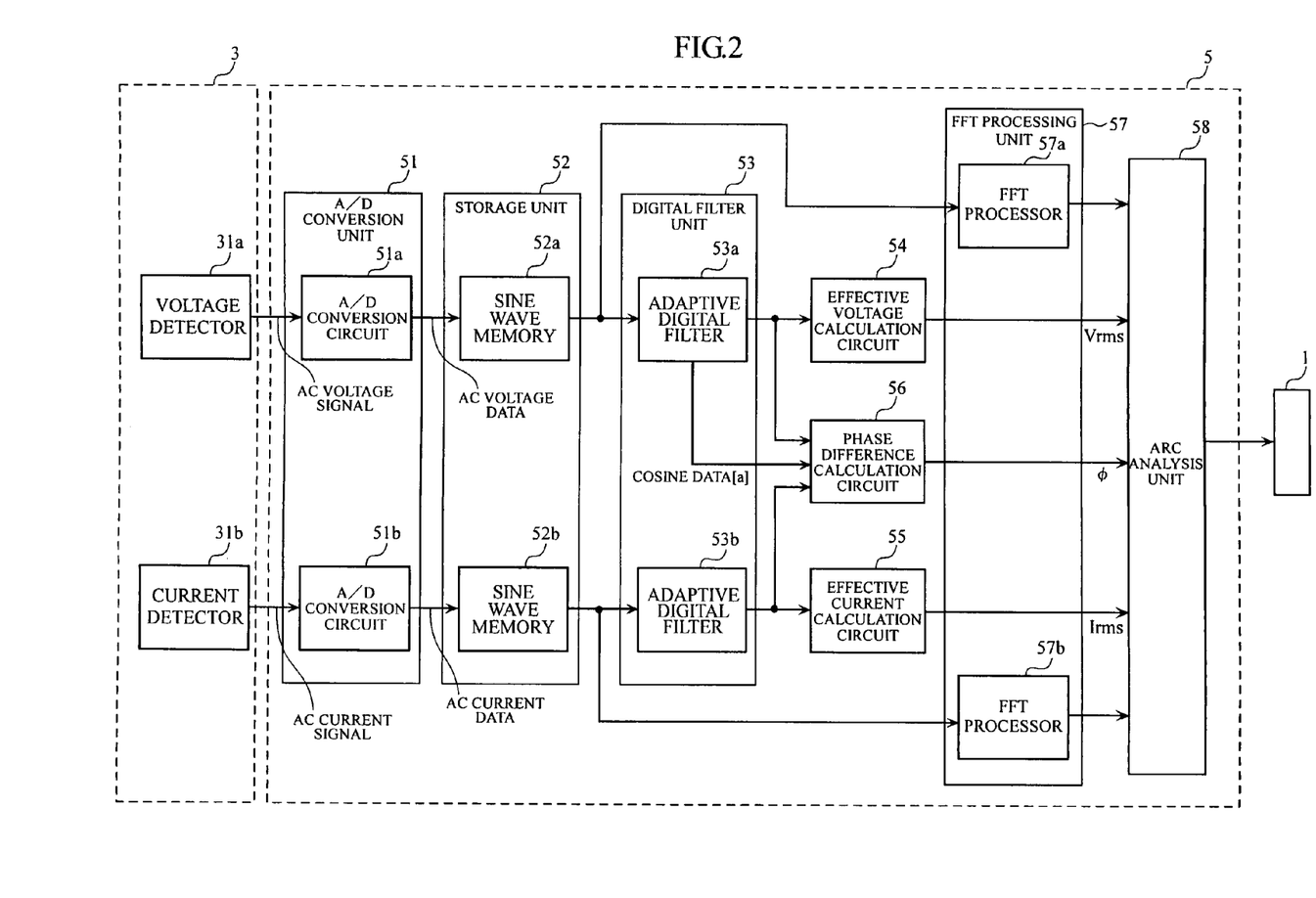
FIG. 2 is a block diagram showing the structure of the arc detector.

The voltage/current detection device 3 detects a voltage signal and a current signal of the high frequency power at the input terminal of the plasma processing unit 4. The voltage/current detection device 3 mainly includes, as shown in FIG. 2, a voltage detection unit 31a that primarily detects an analog AC voltage signal, and a current detection unit 31b that detects an analog AC current signal. The voltage detection unit 31a detects an AC voltage signal from the transmission line, and amplifies and outputs the signal, and the current detection unit 31b detects an AC current signal from the transmission line, and amplifies and outputs the signal.

The AC signal detected by the voltage/current detection device 3 is digitally processed in the arc detector 5. Accordingly, in case where the AC signal is detected at a low level, the calculation accuracy in the digital processing may be degraded. In this embodiment, the signal detected by the voltage detection unit 31a and the current detection unit 31b are amplified, to thereby facilitate the arc detector 5 to stably perform the digital processing.

The plasma processing unit 4 performs an etching or a CVD process so as to process the workpiece. The plasma processing unit 4 includes a container (chamber) 41 that encloses therein a predetermined gas such as nitrogen gas or argon gas, for generating the plasma, and a pair of electrodes 42, 43 via which the high frequency power from the high frequency power source 1 is applied to the gas in the container 41.

The plasma processing unit 4 executes various types of processing works according to the purpose of processing the workpiece B. For example, in the case of performing an etching on the workpiece, the type and pressure of the gas, the value of the high frequency power to be supplied, the power supply time and so forth are appropriately determined according to the intended etching process, for executing the processing. To actually execute the process, the gas for plasma generation such as nitrogen gas or argon gas is enclosed in the container 41 in which the workpiece B is placed, and once the high frequency power starts to be supplied to the electrodes 42, 43 a high frequency field P is generated between the electrodes 42, 43, so that the high frequency field P turns the gas into the plasma state. Thus, the gas in the plasma state serves to process the workpiece.

The arc detector 5 digitally processes the AC voltage signal and the AC current signal output from the voltage/current detection device 3, and determines whether an arc has been generated according to the digital processing result. When the arc generation is detected, the arc detector 5 outputs an arc detection signal to the high frequency power source 1.

As shown in the block diagram of FIG. 2, the arc detector 5 includes an A/D conversion unit 51, a storage unit 52, a digital filter unit 53, a voltage effective value calculation circuit 54, a current effective value calculation circuit 55, a phase difference calculation circuit 56, a fast Fourier transformation (hereinafter, FFT) processing unit 57, and an arc analysis unit 58. The A/D conversion unit 51 converts an analog signal (AC voltage signal and AC current signal) output from the voltage/current detection device 3 into a digital signal, and outputs the digital signal to the storage unit 52. (Hereinafter, the converted AC voltage digital signal will be referred to as "AC voltage data", and the converted AC current digital signal as "AC current data".) The storage unit 52 stores therein the AC voltage data and the AC current data for a predetermined number of cycles. The digital filter unit 53 extracts the AC voltage data and the AC current data of a desired frequency, from the AC voltage data and the AC current data stored in the storage unit 52. The voltage effective value calculation circuit 54 calculates the root-mean-square value Vrms of the AC voltage signal. The current effective value calculation circuit 55 calculates the root-mean-square value Irms of the AC current signal. The phase difference calculation circuit 56 calculates the phase difference $\phi$ between the AC voltage signal and the AC current signal. The FFT processing unit 57 calculates the distribution of frequency components included in the AC voltage signal based on the AC voltage data stored in the storage unit 52, as well as the distribution of frequency components included in the AC current signal based on the AC current data. The arc analysis unit 58 analyzes the information output from the respective effective value calculation circuits 54, 55, the phase difference calculation circuit 56, and the FFT processing unit 57, to thereby detect the arc generation.

The A/D conversion unit 51 includes an A/D conversion circuit 51a that handles the AC voltage signal and another A/D conversion circuit 51b that handles the AC current signal. The storage unit 52 includes a sine wave memory 52a that stores therein the AC voltage data and another sine wave memory 52b that stores therein the AC current data. The number of cycles over which the data is to be stored in the sine wave memories 52a, 52b varies according to the frequency of the supplied power, and may be altered by setting different parameters. For example, in the case where the high frequency power source 1 supplies the power at the frequency of 2.0 MHz, the sine wave memories 52a, 52b respectively store the data corresponding to 100 cycles. In this case the time for the 100 cycles is 50 μs, and hence the storage unit 52 stores the data for 100 cycles sampled every 50 μs. The data for 100 cycles is subjected to predetermined processing in the circuits of posterior stages such as the FFT processing unit 57, so as to be utilized as the data for deciding the arc generation.

The digital filter unit 53 includes an adaptive digital filter 53a for extracting AC voltage data of a desired frequency out of the AC voltage data, and another adaptive digital filter 53b for extracting AC current data of a desired frequency out of the AC current data. Here, the desired frequency refers to the frequency of the high frequency power output from the high frequency power source 1, for example the frequency of 2.0 MHz employed in the plasma processing system.

The adaptive digital filters 53a, 53b are constituted of an infinite impulse response (IIR) low-pass filter, and eliminate frequency components exceeding a predetermined cut-off frequency, out of the AC signal data input thereto. The adaptive digital filters 53a, 53b are capable of, for example, adjusting a resonant frequency fo so as to track a desired frequency. The adaptive digital filter 53a outputs the AC voltage data and cosine data [a], and the adaptive digital filter 53b outputs the AC current data. The cosine data [a] is a coefficient that determines the center frequency of the passband of the digital filter, which is calculated each time the digital data (sampling data) is input to the digital filter, such that the difference in level value between the input data and the output data becomes minimal. Although the cosine data [a] is output from the adaptive digital filter 53a in FIG. 2, the adaptive digital filter 53b outputs the cosine data when the AC current signal is larger in amplitude.

The voltage effective value calculation circuit 54 calculates the root-mean-square value Vrms based on the AC voltage data output from the adaptive digital filter 53a. Likewise, the current effective value calculation circuit 55 calculates the root-mean-square value Irms based on the AC current data output from the adaptive digital filter 53*b*.

The phase difference calculation circuit 56 calculates the phase difference φ between the AC voltage data and the AC current data, based on the AC voltage data and the AC current data output from the adaptive digital filters 53*a*, 53*b* and the cosine data.

Figure 3:
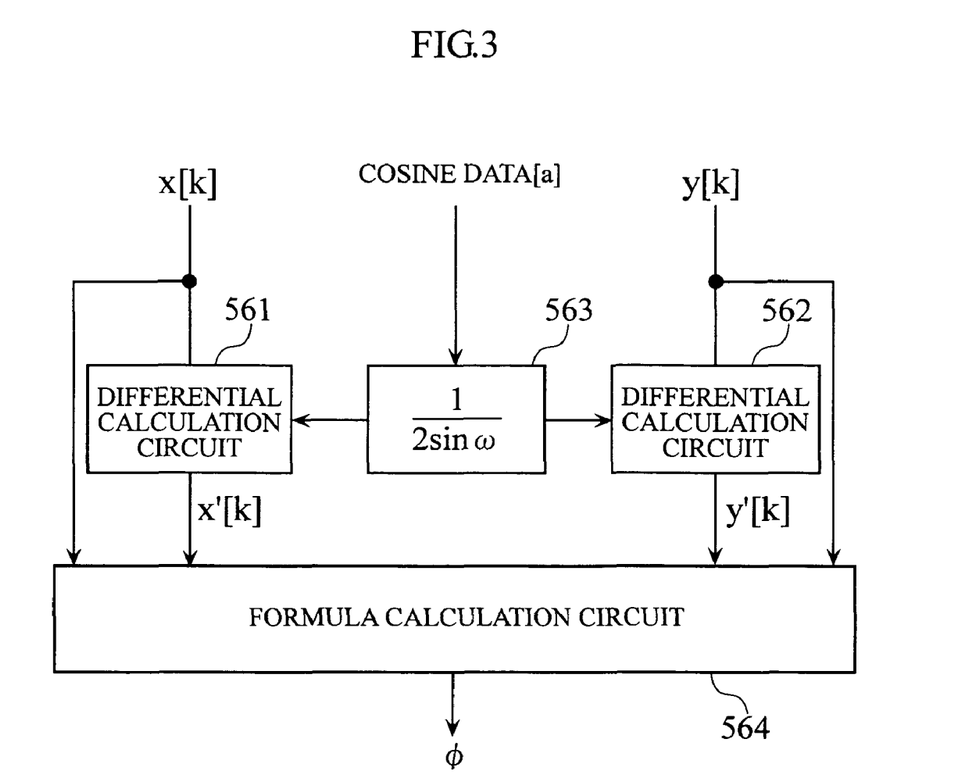
FIG. 3 is a block diagram showing the structure of a phase difference calculation circuit of the arc detector.

FIG. 3 is a block diagram showing a structure of the phase difference calculation circuit 56. The phase difference calculation circuit 56 includes a pair of differential calculation circuits 561, 562, an arithmetic calculation circuit 563, and a formula calculation circuit 564.

The differential calculation circuit 561 differentiates the AC voltage data x[k] to thereby output differential AC voltage data x'[k]. The differential calculation circuit 562 differentiates the AC current data y[k], to thereby output differential AC voltage data y'[k]. The arithmetic calculation circuit 563 calculates 1/(2 sin ω) based on the cosine data [a] input thereto, and outputs the calculated value to the respective differential calculation circuits 561, 562. The formula calculation circuit 564 calculates the phase difference φ through the following equations (1) to (3), based on the AC voltage data x[k], the AC current data y[k], as well as the differential AC voltage data x'[k] and the differential AC current data y'[k] output from the differential calculation circuits 561, 562.

$$\cos\phi = \frac{1}{A_1 A_2}\{x[k]y[k] + x'[k]y'[k]\} \quad (1)$$

$$\sin\phi = \frac{1}{A_1 A_2}\{x[k]y'[k] - x'[k]y[k]\} \quad (2)$$

$$\phi = \arctan(\sin\phi / \cos\phi) \quad (3)$$

Referring back to FIG. 2, the FFT processing unit 57 includes a FFT processor 57*a* that receives the AC voltage data stored in the sine wave memory 52*a*, and another FFT processor 57*b* that receives the AC current data stored in the sine wave memory 52*b*. The FFT processor 57*a* calculates the spectrum of each frequency (fundamental wave and each harmonic) based on the AC voltage data input from the storage unit 52 through the fast Fourier transformation process, to thereby output the output level of a predetermined frequency. Likewise, the FFT processor 57*b* calculates the spectrum of each frequency (fundamental wave and each harmonic) based on the AC current data input from the storage unit 52, to thereby output the output level of a predetermined frequency.

Figure 4:
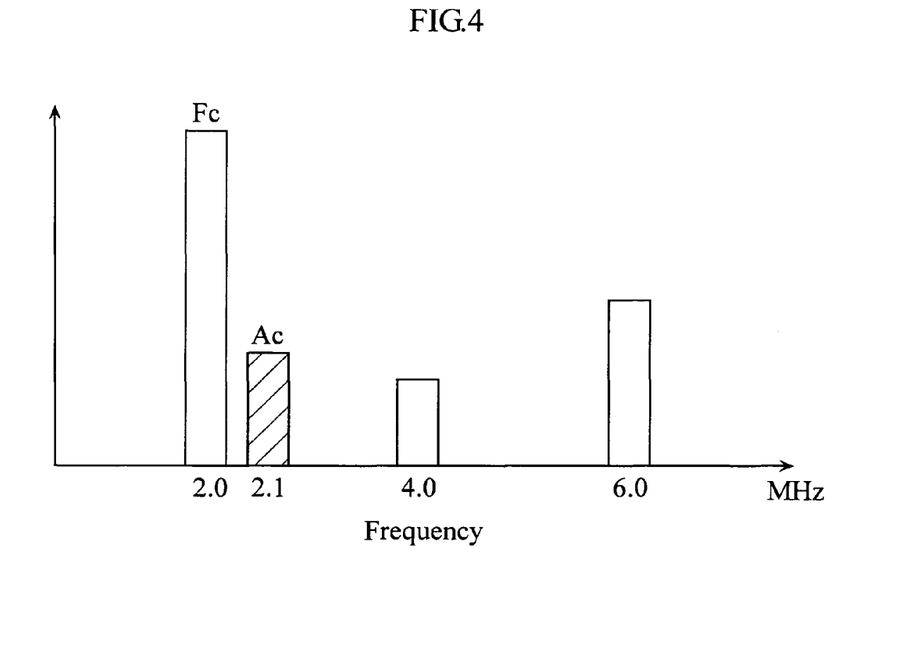
FIG. 4 is a graph showing a spectrum distribution obtained through fast Fourier transformation of an AC voltage signal of a power supplied at 2.0 MHz.

In the frequency distribution obtained through the fast Fourier transformation process, the frequency of the power output by the high frequency power source appears with a maximal output level as a principal component. A frequency component that constitutes the harmonic of the output power also appears. For example, in the case where the high frequency power source outputs the power at the frequency of 2.0 MHz, the principal component (Fc) appears at 2.0 MHz, the second harmonic component at 4.0 MHz, and the third harmonic component at 6.0 MHz, as shown in FIG. 4. In general, an n-th harmonic component appears at 2×n MHz.

It is experimentally known that a specific frequency component appears in the spectrum in case that an arc is generated in the plasma processing unit during the plasma processing. The specific frequency component varies depending on the condition in the plasma processing unit and the frequency of the supplied power, and also on whether the data input to the FFT processor is the AC voltage data or the AC current data. For example, it is known that a frequency component of 2.1 MHz emerges if an arc is generated while the power is being supplied at the frequency of 2.0 MHz, as indicated by Ac in FIG. 4.

Therefore, it may be determined that an arc has been generated if the frequency component reaches a predetermined output level, through applying the fast Fourier transformation to the AC voltage data or the AC current data, and monitoring the appearance of the frequency component originating from the arc generation. In this embodiment, it is determined that an arc has been generated if the frequency component of 2.1 MHz appears at the output level of 5% with respect to that of the principal component, in the AC voltage signal. Here, the frequency component to be monitored varies depending on the condition in the plasma processing unit, and two or more frequency components may be monitored at a time. Also, only either of the AC voltage data or the AC current data, or the both thereof may be monitored.

The arc analysis unit 58 calculates the impedance of the plasma processing unit, based on the root-mean-square value Vrms of the AC voltage signal (calculated by the voltage effective value calculation circuit 54), the root-mean-square value Irms of the AC current signal (calculated by the current effective value calculation circuit 55), and the phase difference φ between the AC voltage signal and the AC current signal (calculated by the phase difference calculation circuit 56). The impedance of the plasma processing unit is calculated through the following equations (4) and (5), in which R represents a resistance component and X a reactance component:

$$R = (Vrms/Irms) \cdot \cos\phi \quad (4)$$

$$X = (Vrms/Irms) \cdot \sin\phi \quad (5)$$

The arc analysis unit 58 determines that there is a possibility that an arc has been generated, when the fluctuation rate of the calculated impedance exceeds a predetermined range (tentative decision). At this moment, the arc analysis unit 58 also determines whether or not the two output levels, i.e. the output level of a predetermined frequency component included in the spectrum of the AC voltage signal calculated by the FFT processor 57*a* and the output level of a predetermined frequency component included in the spectrum of the AC current signal calculated by the FFT processor 57*b* are higher than predetermined threshold values. Then in the case where the output levels of the both frequency components are higher than the thresholds, the arc analysis unit 58 determines that an arc has been generated (definite decision), and transmits the arc detection signal to the high frequency power source 1. Here, it may be determined that an arc has been generated in the case where only either of the output level of the predetermined frequency component of the AC voltage signal or that of the AC current signal exceeds its threshold value, in the process of making the definite decision.

Figure 5:
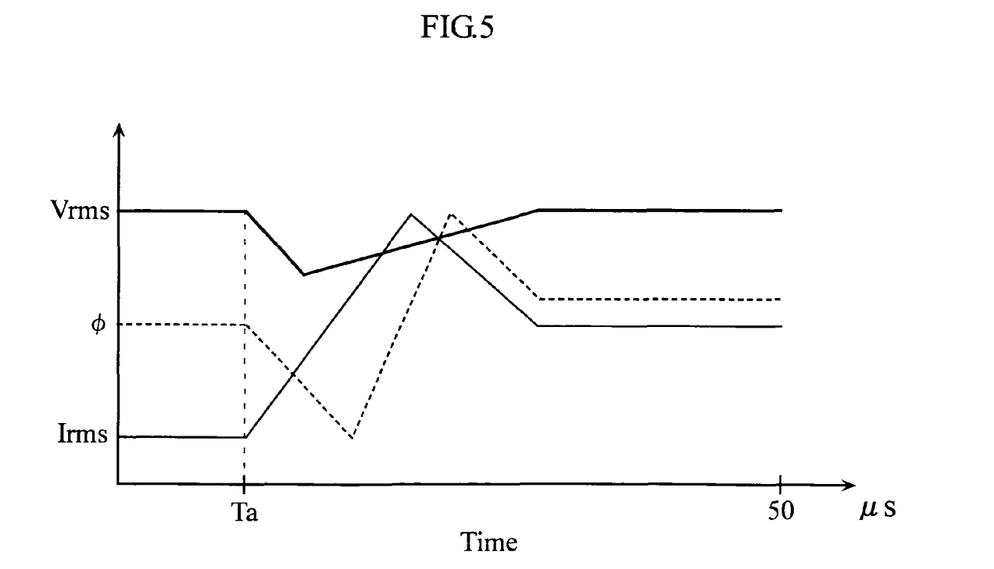
FIG. 5 is a graph showing fluctuation of a voltage root-mean-square value Vrms, a current root-mean-square value Irms, and a phase difference φ over a period of 100 cycles with a supply of high frequency power of 2.0 MHz.

It is also experimentally known that the arc generation in the plasma processing unit provokes a certain fluctuation in the root-mean-square value Vrms of the AC voltage signal, the root-mean-square value Irms of the AC current signal, and in the phase difference φ between the AC voltage signal and the AC current signal. FIG. 5 is a graph showing fluctuation of the voltage root-mean-square value Vrms, the current root-mean-square value Irms, and the phase difference φ over a period of 100 cycles (i.e. 50 μs) under the high frequency power supply of 2.0 MHz. As will be understood from FIG. 5, the root-mean-square value Vrms sharply decreases, the root-mean-square value Irms sharply increases, and the phase difference φ sharply decreases after the point Ta where the arc is generated in the plasma processing unit. Based on this, it may be determined that an arc has been generated if the fluctuation rate of the root-mean-square value Vrms is lower than a predetermined value, if the fluctuation rate of the root-mean-square value Irms is higher than a predetermined value, or if the fluctuation rate of the phase difference φ is outside of a predetermined range. Therefore, when the arc analysis unit 58 determines that there is a possibility that an arc has been generated (tentative decision), those three conditions may be employed as the criteria for the definite decision of the arc generation.

Specifically, the definite decision of the arc generation is to be made by the arc analysis unit 58 according to the following five criteria.

(1) Whether the output level of the predetermined frequency component included in the spectrum of the AC voltage signal (in this embodiment, 2.1 MHz) is not lower than the predetermined value (in this embodiment, 5% of the principal component)

(2) Whether the output level of the predetermined frequency component included in the spectrum of the AC current signal (in this embodiment, 2.1 MHz) is not lower than the predetermined value (in this embodiment, 5% of the principal component)

(3) Whether the fluctuation rate of the root-mean-square value Vrms of the AC voltage signal is not higher than the predetermined value (in this embodiment, −5%)

(4) Whether the fluctuation rate of the root-mean-square value Irms of the AC current signal is not lower than the predetermined value (in this embodiment, 5%)

(5) Whether the fluctuation rate of the phase difference φ between the AC voltage signal and the AC current signal is outside of the predetermined range (in this embodiment, ±15%)

Optimal combination of the foregoing criteria is different depending on the condition in the plasma processing unit and the processing condition such as the frequency of the supplied power. The user may select one of those criteria or a combination of two or more thereof, and set such criteria in the arc analysis unit 58.

It is to be noted that the foregoing criteria are only exemplary. For example, under a different processing condition (such as the type or pressure of the gas), the fluctuation rate of the root-mean-square value Vrms of the AC voltage signal and other data become different. Although the example shown in FIG. 5 represents the case where the root-mean-square value Vrms decreases when an arc is generated in the plasma processing unit, the root-mean-square value Vrms may rather increase. Accordingly, the criteria that are appropriate for the processing to be executed are to be selected.

In the foregoing embodiment, it is tentatively determined that an arc may be generated, when the fluctuation rate of the impedance of the plasma processing unit exceeds the predetermined range (first range), and then the definite decision (additional decision) of the arc generation is made. According to the present invention, a second range broader than the first range may be incorporated, so as to execute the following operation. When the fluctuation rate of the impedance of the plasma processing unit exceeds not only the first range but also the second range (i.e. when the impedance of the plasma processing unit 4 has extremely drastically fluctuated), the arc analysis unit 58 determines that a hard arc has been generated, and immediately (without making the additional decision of the arc generation) cuts off the output from the high frequency power source 1. Further, according to the present invention, it may be determined that there is a possibility that an arc has been generated when the fluctuation rate of the reflected power from the plasma processing unit 4 or the reflection coefficient exceeds a predetermined value.

Figure 6:
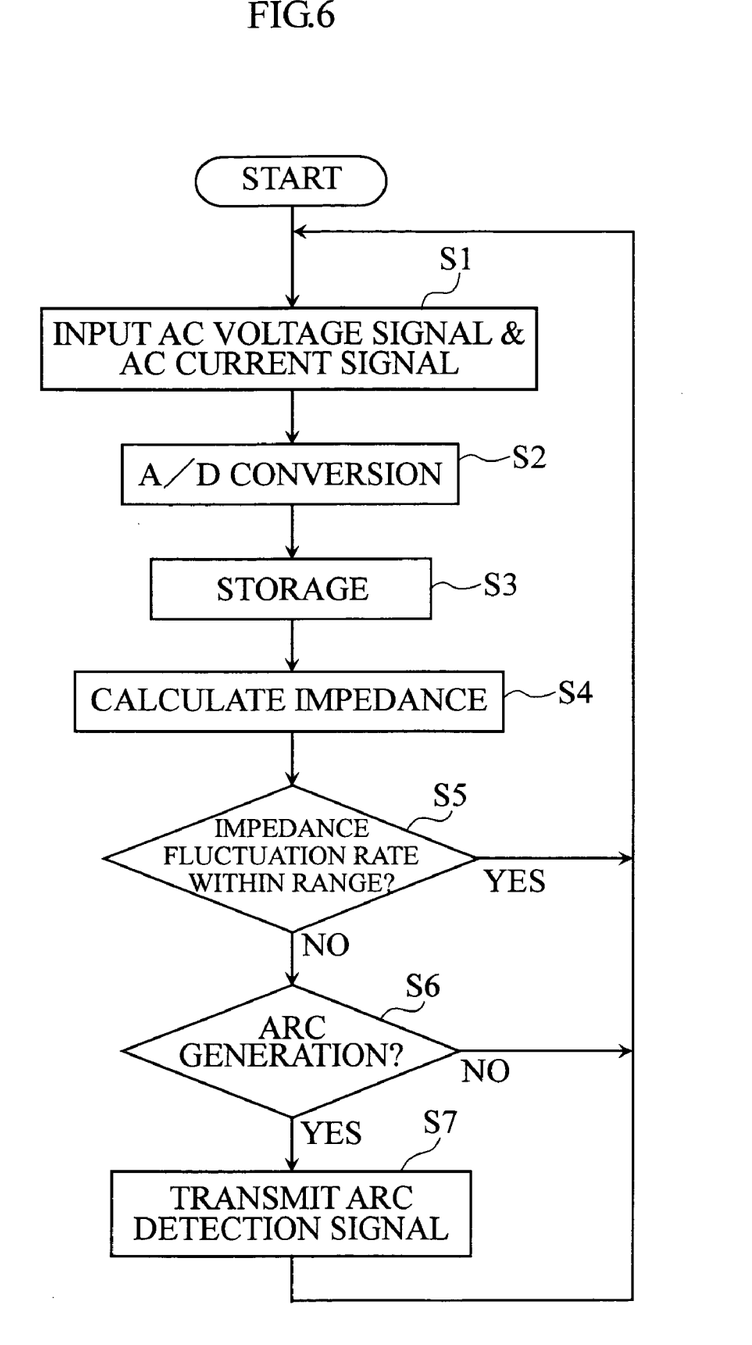
FIG. 6 is a flowchart showing the operation process of the arc detector.

An operation process in the arc detector 5 will now be described, referring to the flowchart of FIG. 6.

The voltage/current detection device 3 inputs the AC voltage signal and the AC current signal to the arc detector 5 (S1). These signals are converted into the AC voltage data and the AC current data, which are digital data, at the A/D conversion unit 51 (S2). The AC voltage data and the AC current data are stored in the storage unit 52 (S3).

When the data corresponding to 100 cycles is accumulated in the storage unit 52, the frequency components required by the digital filter unit 53 are extracted, and the voltage root-mean-square value Vrms, the current root-mean-square value Irms, and the phase difference φ are calculated by the voltage effective value calculation circuit 54, the current effective value calculation circuit 55, and the phase difference calculation circuit 56, respectively. The arc analysis unit 58 then calculates the impedance of the plasma processing unit 4, based on those values (S4).

It is determined whether the fluctuation rate of the calculated impedance is within the predetermined range (S5). If the fluctuation rate exceeds the predetermined range (NO at S5), it is determined that there is a possibility that an arc has been generated, and the definite decision is made according to the criteria set in advance (S6). If it is determined that an arc has been generated (YES at S6), the arc detection signal is transmitted to the high frequency power source 1 (S7). Then the operation process returns to the step S1.

If the arc generation is not determined at the step S6 (NO at S6), the process returns to the step 1.

If the fluctuation rate of the impedance is within the predetermined range at the step S5 (YES at S5), the process returns to the step 1.

According to the foregoing embodiment, the decision of the possibility of the arc generation based on the fluctuation rate of the impedance is followed by the definite decision of the arc generation, which is made according to the additional criteria. Therefore, although a natural impedance fluctuation is once determined to be a fluctuation originating from the arc generation, it is determined that the arc has not been generated if the additional criteria do not apply. Such procedure enables preventing erroneous detection of the arc generation, even though the normal range of the fluctuation rate of the impedance is narrowed in order to facilitate detecting the soft arc.

The foregoing embodiment represents the case where the high frequency power source is of a fixed frequency type, and the impedance matching device is a variable impedance matching device. Nevertheless, the arc detector according to the present invention may also be applied to a plasma processing unit including a combination of a variable frequency type high frequency power source and a fixed impedance matching device.

The invention claimed is:

1. A plasma processing system comprising a high frequency power source, a plasma processing unit for processing a workpiece by plasma generation using high frequency power from the high frequency power source, a voltage/current signal detection circuit for detecting an AC voltage signal and an AC current signal applied to the plasma processing unit signal and an AC current signal, and an arc detector for detecting generation of an arc at the plasma processing unit, the plasma protecting system comprising:

a phase difference calculation circuit that calculates a phase difference between the AC voltage signal and the AC current signal;

a voltage effective value calculation circuit that calculates a voltage root-mean-square value of the AC voltage signal;

a current effective value calculation circuit that calculates a current root-mean-square value of the AC current signal;

a FFT processing unit that calculates a frequency spectrum of at least one of the AC voltage signal and the AC current signal; and an arc analysis unit connected to the phase difference calculation circuit, the voltage effective value calculation circuit, the current effective value calculation circuit, and the FFT processing unit for receiving the calculated phase difference, the calculated voltage root-mean-square value, the calculated current root-mean-square value and the calculated frequency spectrum, respectively;

wherein the arc analysis unit determines generation of an arc in the plasma processing unit when at least one of the following conditions is met;

(a) an output level of a predetermined frequency component contained in the frequency spectrum of the AC voltage signal calculated by the FET processing unit is not lower than a predetermined value, (b) an output level of a predetermined frequency component contained in the frequency spectrum of the AC current signal calculated by the FET processing unit is not lower than a predetermined value, (c) a fluctuation rate of the voltage root-mean-square value of the AC voltage signal calculated by the voltage effective value calculation circuit is not higher than a predetermined value, (d) a fluctuation rate of the current root-mean-square value of the AC current signal calculated by the current effective value calculation circuit is not lower than a predetermined value, and (e) a fluctuation rate of the phase difference calculated by the phase difference calculation circuit is outside of a predetermined range.

2. The plasma processing system according to claim 1, wherein the arc analysis unit calculates an impedance of the plasma processing unit using the following equations, $$R=(Vrms/Irms)\cdot\cos\phi$$

$$X=(Vrms/Irms)\cdot\sin\phi$$

where
R: resistance component
X: reactance component
Vrms: calculated voltage root-mean-square value
Irms: calculated current root-mean-square value
$\phi$: calculated phase difference
wherein the arc analysis unit makes a tentative determination of the arc generation when a fluctuation rate of the calculated impedance exceeds a predetermined range, the arc analysis unit making a definite determination of the arc generation when at least one of the conditions (a)-(e) is met.

3. The plasma processing system according to claim 1, wherein the arc analysis unit determines the arc generation in the plasma processing unit when two or more of the conditions (a)-(e) are met at the same time.

4. The plasma processing system according to claim 1, wherein the arc detector further comprises a first A/D converter that converts an analog voltage signal from the voltage/current signal detection circuit into a digital AC voltage signal, and a second A/D converter that converts an analog current signal from the voltage/current signal detection circuit into a digital AC current signal.

5. The plasma processing system according to claim 4, wherein the arc detector further comprises a first memory that stores the digital AC voltage signal from the first A/D converter, and a second memory that stores the digital AC current signal from the second A/D converter.

6. The plasma processing system according to claim 5, wherein the arc detector further comprises a first adaptive filter that extracts AC voltage data of a desired frequency from the first memory for output to the voltage effective value calculation circuit and the phase difference calculation circuit, and a second adaptive filter that extracts AC current data of a desired frequency from the second memory for output to the current effective value calculation circuit and the phase difference calculation circuit.

* * * * *